(12) United States Patent
Ahn et al.

(10) Patent No.: US 8,716,042 B2
(45) Date of Patent: May 6, 2014

(54) SEMICONDUCTOR TEMPLATE SUBSTRATE, LIGHT-EMITTING DEVICE USING A SEMICONDUCTOR TEMPLATE SUBSTRATE, AND MANUFACTURING METHOD THEREFOR

(75) Inventors: Hyung-Soo Ahn, Busan (KR); Min Yang, Busan (KR); Hongju Ha, Busan (KR)

(73) Assignee: CSsolution Co., Ltd., Busan (KR)

( * ) Notice: Subject to any disclaimer, the term of this patent is extended or adjusted under 35 U.S.C. 154(b) by 0 days.

(21) Appl. No.: 13/638,165

(22) PCT Filed: Mar. 31, 2011

(86) PCT No.: PCT/KR2011/002238
§ 371 (c)(1),
(2), (4) Date: Sep. 28, 2012

(87) PCT Pub. No.: WO2011/122882
PCT Pub. Date: Oct. 6, 2011

(65) Prior Publication Data
US 2013/0020594 A1 Jan. 24, 2013

(30) Foreign Application Priority Data

Mar. 31, 2010 (KR) .................. 10-2010-0029496
Jun. 23, 2010 (KR) .................. 10-2010-0059632

(51) Int. Cl.
*H01L 21/00* (2006.01)

(52) U.S. Cl.
USPC ............... 438/28; 438/66; 438/478; 438/483; 257/E25.032

(58) Field of Classification Search
USPC ............... 438/28, 66, 478, 483; 257/E25.032
See application file for complete search history.

(56) References Cited

U.S. PATENT DOCUMENTS

| | | | |
|---|---|---|---|
| 2005/0093099 A1 | 5/2005 | Koike et al. | |
| 2006/0172512 A1* | 8/2006 | Hiramatsu et al. | 438/483 |
| 2007/0085087 A1* | 4/2007 | Okuyama et al. | 257/79 |
| 2011/0143467 A1* | 6/2011 | Xiong et al. | 438/29 |

FOREIGN PATENT DOCUMENTS

| | | |
|---|---|---|
| JP | 2002110569 | 4/2002 |
| JP | 2004-158546 A | 6/2004 |
| JP | 2004-273661 A | 9/2004 |
| JP | 2005142415 | 6/2005 |
| KR | 100531733 | 11/2005 |
| KR | 1020050105516 | 11/2005 |
| KR | 100568830 | 4/2006 |
| KR | 1020100102837 | 9/2010 |
| WO | 2006022532 | 3/2006 |

OTHER PUBLICATIONS

Japanese Office Action corresponding to Japanese Application No. 2013-502484, dated Nov. 12, 2013.

* cited by examiner

*Primary Examiner* — Julia Slutsker
(74) *Attorney, Agent, or Firm* — Bacon & Thomas, PLLC

(57) ABSTRACT

A light-emitting device includes a semiconductor layer, a light-emitting stack structure formed on a first surface of the semiconductor layer, and a plurality of inverted pyramid structures formed on a second surface of the semiconductor layer opposite to the first surface. Each of the inverted pyramid structures has a sectional area increasing as each of the inverted pyramid structures is more extended in a vertical direction from the second surface.

13 Claims, 10 Drawing Sheets

SEMICONDUCTOR TEMPLATE SUBSTRATE, LIGHT-EMITTING DEVICE USING A SEMICONDUCTOR TEMPLATE SUBSTRATE, AND MANUFACTURING METHOD THEREFOR

TECHNICAL FIELD

The present invention relates to a semiconductor template substrate, a light-emitting device using the same, and a method of manufacturing the light-emitting device, and more particularly, to a semiconductor template substrate for decreasing defective crystalline and enabling easy separation, a light-emitting device using the same, and a method of manufacturing the light-emitting device.

BACKGROUND ART

Conventional semiconductor light-emitting devices are formed as horizontal devices or vertical devices with an insulating substrate such as sapphire. For example, FIG. 6A illustrates a conventional horizontal semiconductor light-emitting device, and FIG. 6B illustrates a conventional vertical semiconductor light-emitting device.

The horizontal semiconductor light-emitting device includes a buffer layer 2, an n-type nitride semiconductor layer 3, an active layer 4, and a p-type nitride semiconductor layer 5 that are sequentially stacked on a sapphire substrate 1. A p-type electrode 6 is formed on the p-type nitride semiconductor layer 5, and, by removing a partial region of the p-type nitride semiconductor layer 5 and active layer 4 in an etching process, an n-type electrode 7 is formed on an exposed portion of the n-type nitride semiconductor layer 3. However, in the horizontal light-emitting device of FIG. 6A, a light-emitting area is relatively reduced, and a surface leakage current increases, causing the decrease in the emission performance of the horizontal light-emitting device. In addition, since an area through which a current passes is relatively small, a resistance increases, and thus, an operating voltage increases. For this reason, heat is generated, causing the reduction in the service life of the horizontal light-emitting device.

Moreover, in the vertical light-emitting device of FIG. 6B, an operation of forming a p-type nitride semiconductor layer 5 on a substrate is the same as that of the horizontal light-emitting device. An insulating substrate is separated from the light-emitting device before an n-type electrode 7 is formed, and then, the n-type electrode 7 is formed at a bottom of an n-type semiconductor layer 3. In this case, a laser lift-off process is generally used for separation of the insulating substrate. By irradiating a laser beam, which is a strong energy source, on a backside of a transparent sapphire substrate, the laser beam is strongly absorbed in a interface between a buffer layer and the sapphire substrate, and thus, a temperature of 900° C. or more is momentarily produced, whereby a nitride semiconductor in the interface is thereto-chemically dissolved and the sapphire substrate is separated from the vertical light-emitting device. However the laser lift-off process causes the thermal/mechanical deformation of a light-emitting stack structure including an active layer. For example, a mechanical stress occurs between the nitride semiconductor layer and a thick sapphire substrate due to different lattice constants and heat expansion coefficients, and, the vertical nitride semiconductor light-emitting device suffers a mechanical/thermal damage because the vertical nitride semiconductor light-emitting device cannot endure the mechanical stress.

As described above, when a thin film of a stack light-emitting structure is damaged, a high leakage current is caused, and moreover, the chip yield of light-emitting devices is largely reduced, causing the reduction in the entire performance of the light-emitting devices.

DISCLOSURE

Technical Problem

In view of the above, the present invention provides a semiconductor template substrate for preventing the damage of a semiconductor substrate in performing a separation process.

Further, the present invention provides an excellent semiconductor light-emitting device.

Further, the present invention provides a method of manufacturing an excellent semiconductor light-emitting device.

Technical Solution

The present invention relates to an approach to solve the above described problems. In forming a light-emitting device, a separation layer is used to facilitate ease separation of the light-emitting device from a semiconductor substrate. According to the present invention, the light-emitting device has an inverted pyramid structure due to the separation layer.

In accordance with a first aspect of the present invention, there is provided a light-emitting device. The light-emitting includes a semiconductor layer, a light-emitting stack structure, and a plurality of inverted pyramid structures. The light-emitting stack structure is formed on a first surface of the semiconductor layer and each of the inverted pyramid structures is formed on a second surface of the semiconductor layer opposite to the first surface. Each of the inverted pyramid structures has a sectional area decreasing as each of the inverted pyramid structures is more extended in a vertical direction from the second surface.

In accordance with a second aspect of the present invention, there is provided a method of manufacturing a light-emitting device. A buffer layer is formed on a substrate. A plurality of pyramid structures protruding from the buffer layer. A semiconductor layer separated from the buffer layer is formed. A semiconductor layer separated from the buffer layer is formed by growing a crystal from on each of the pyramid structures. The pyramid structures connect the buffer layer and the semiconductor layer. A light-emitting stack structure is formed on the semiconductor layer. Each of the pyramid structures is severed or a contact surface between each of the pyramid structures and the buffer layer is separated to separate the semiconductor layer from the buffer layer.

In accordance with a third aspect of the present invention, there is provided a method of manufacturing a light-emitting device. A buffer layer is formed on a substrate. The buffer layer is divided into a plurality of separate light-emitting device regions to form divided separate semiconductor layers respectively formed in the separate light-emitting device regions. The separate semiconductor layers respectively farmed in the separate light-emitting device regions are connected to the buffer layer corresponding to the separate light-emitting device regions by a plurality of protrusions. A light-emitting stack structure is formed on each of the separate semiconductor layers. Each of the pyramid structures is severed or a contact surface between each of the pyramid structures and the buffer layer is separated to separate the semiconductor layers from the buffer layer.

In accordance with a fourth aspect of the present invention, there is provided a method of manufacturing a light-emitting device. A buffer layer is formed on a substrate. The buffer layer is divided into a plurality of light-emitting device regions, and a plurality of pyramid structures are respectively formed in the light-emitting device regions. The pyramid structures is grown from respective tops of the pyramid structures to form a semiconductor layer having a cleavage surface that divides the light-emitting device regions. The semiconductor layer and the buffer layer are connected by the pyramid structures, and the semiconductor layer is separated from the buffer lay. A light-emitting stack structure is formed on the semiconductor layer to make a separate auxiliary light-emitting device. Each of the pyramid structures to strip the semiconductor layer is severed from the buffer layer. The separate auxiliary light-emitting device is separated with respect to the cleavage surface.

In accordance with a fifth aspect of the present invention, there is provided a method of manufacturing a light-emitting device. A buffer layer is formed on a substrate. The buffer layer is divided into a plurality of light-emitting device regions to form a plurality of pyramid structures in the light-emitting device regions. The pyramid structures is grown from respective tops of the pyramid structures to form a plurality of semiconductor layers that correspond to the respective light-emitting device regions and are separated from each other are formed. The semiconductor layers and the buffer layer are connected by the pyramid structures, and the semiconductor layers are separated from the buffer layer. The light-emitting stack structures are formed on the semiconductor layers to form separate light-emitting devices. The pyramid structures is severed to form light-emitting devices separated each other.

In accordance with a sixth aspect of the present invention, there is provided a semiconductor substrate template. The semiconductor substrate template includes a buffer layer formed on a substrate, a plurality of pyramid structures formed on the buffer layer, and a semiconductor layer formed on the buffer layer. The semiconductor layer is separated from the buffer layer and connected to the buffer layer by the plurality of pyramid structures.

In accordance with a seventh aspect of the present invention, there is provided a semiconductor substrate template. The semiconductor substrate template includes a buffer layer formed on a substrate, the buffer layer being divided into a plurality of auxiliary light-emitting regions, a plurality of protrusions protruding upward from the respective auxiliary light-emitting regions, and a plurality of separate semiconductor layers formed on the respective protrusions to be separated from the buffer layer, in the respective auxiliary light-emitting regions.

Advantageous Effects

According to embodiments of the present invention, a semiconductor substrate is simply separated from an insulating substrate, and thus, the semiconductor substrate is not damaged, thereby manufacturing a light-emitting device having excellent performance. Also, a concave-convex pattern is formed at a bottom of a semiconductor substrate without a separate additional process, thus simplifying a manufacturing process. Moreover, the semiconductor substrate cannot be damaged even in a process of separating a separate light-emitting device from the semiconductor substrate.

BEST MODE

Hereinafter, embodiments of the present invention will be described in detail with reference to the accompanying drawings so that they can be readily implemented by those skilled in the art.

Figure 1A:
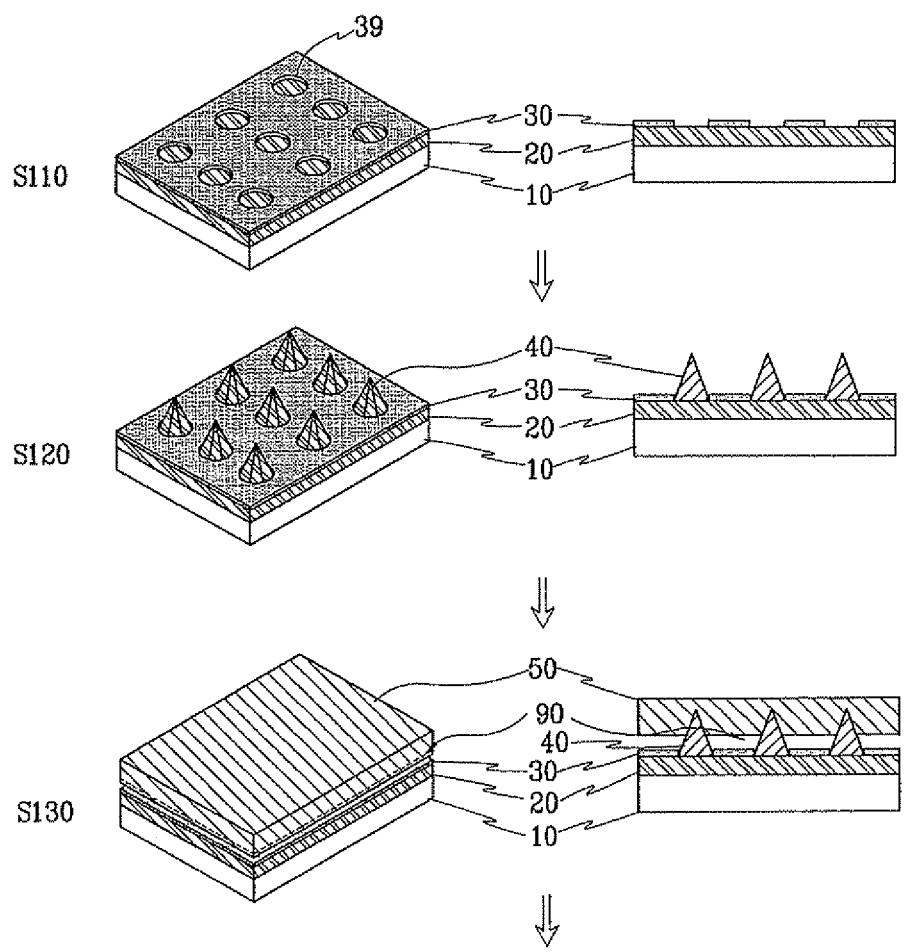
FIGS. 1A and 1B are views illustrating a method of manufacturing a light-emitting device in accordance with an embodiment of the present invention.
Figure 1B:
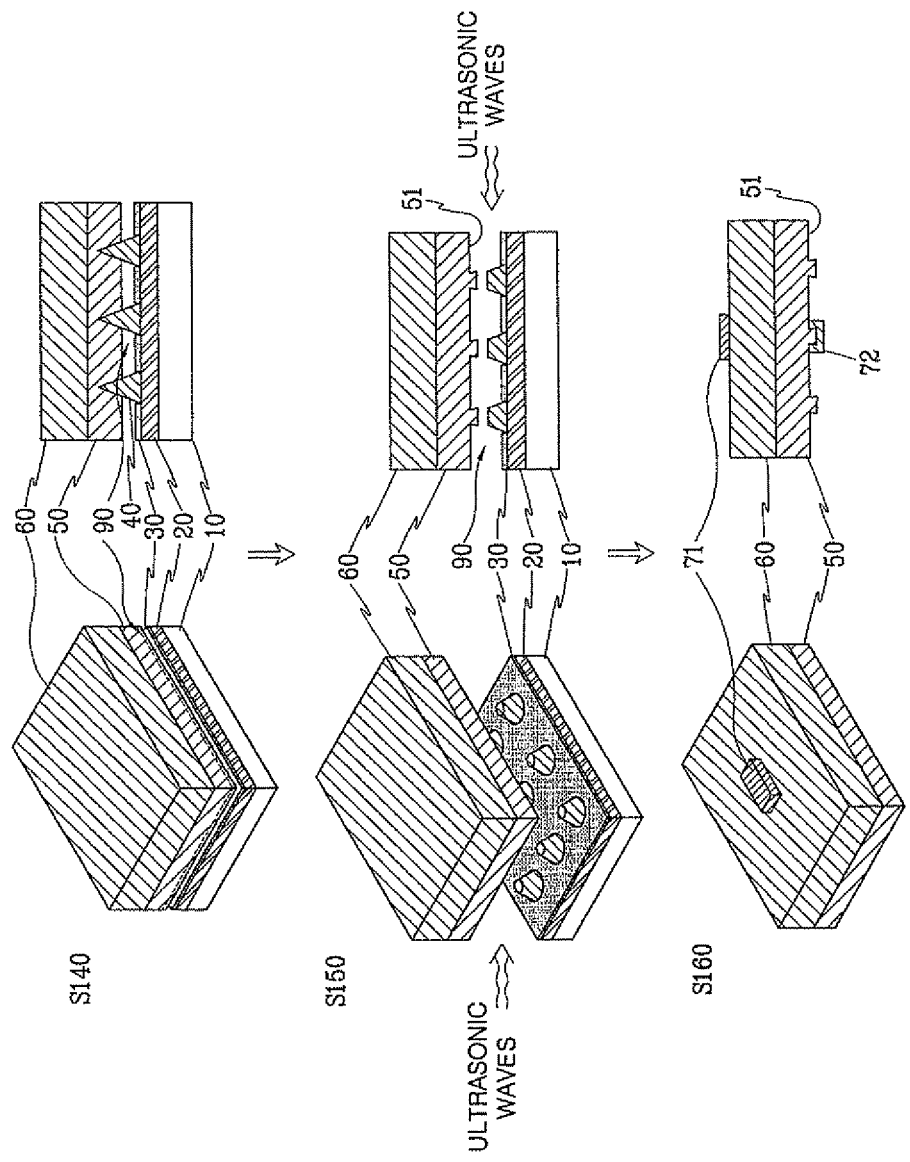

First, a semiconductor crystal manufacturing method in accordance with an embodiment of the present invention will be described with reference to FIGS. 1A and 1B. For example, the present embodiment is an embodiment for growing an n-type GaN crystal with a sapphire substrate. However, materials that are used for a substrate and a buffer layer, a semiconductor layer, and a light-emitting stack structure are not limited thereto.

In operation S110, a buffer layer 20 is formed on an insulating substrate 10, and a mask layer 30 having a plurality of exposure patterns 39 is formed on the buffer layer 20. In FIG. 1A, the exposure patterns 39 are illustrated in a circular shape. However, the exposure patterns 39 may be formed in a polygonal shape such as a tetragonal shape, a triangular shape, or a hexagonal shape, and may be variously arranged.

The substrate 10 may be a sapphire substrate or a substrate including silicon, GaAs, InP, and SiC, and may be selected from a group consisting of various materials.

In an embodiment of the present invention, the buffer layer 20 may be formed by growing a GaN crystal. For example, the buffer layer 20 may be formed by growing an n-type GaN crystal to a thickness of 2 μm to 5 μm with a HVPE crystal growing device. Unlike this, the buffer layer 20 may include an $Al_xGa(1-x)N$ ($0<x<1$) layer or $Al_2O_3$, and AlN or ZnO.

The material of the mask layer 30 may use $SiO_2$ or $Si_3N_4$, and metal such as Cr, Au, Ti, or Ni. For example, $SiO_2$ or $Si_3N_4$ is deposited to a thickness of 500 Å to 5000 Å on the buffer layer 20 in PECVD, and then, by forming the exposure pattern 39 in a photolithography process, a portion of the buffer layer 20 is exposed.

Alternatively, the exposure pattern may be formed by depositing $SiO_2$ or $Si_3N_4$ to a thickness of 500 Å to 5000 Å, or metal such as Cr, Au, Ti, or Ni may be deposited in an exposure pattern shape. For example, the mask layer 30 may be formed by a lift-off process. Photoresist is applied on the buffer layer 20, and an exposure process is performed. Subsequently, a photoresist pattern is formed by performing a development process. Therefore, the buffer layer 20 having a desired pattern shape is exposed, and the other portion is covered by the photoresist pattern. An auxiliary mask layer (not shown) is formed on the photoresist pattern formed on the buffer layer 20. Subsequently, the photoresist pattern and the auxiliary mask layer formed on the photoresist pattern are removed. Accordingly, the mask layer 30 having a desired pattern may be formed on the buffer layer 20.

In an embodiment of the present invention, in case where the exposure pattern 39 is circular in shape, a diameter of each of the exposure patterns 39 is about 0.5 μm to about 5 μm, and an interval between adjacent exposure patterns 39 is about 0.5 μm to about 10 μm.

In operation S120, a crystal is grown from the buffer layer 20 exposed by the exposure pattern 39. For example, by selectively growing an n-type GaN crystal with the HVPE crystal growing device, a pyramid structure 40 is formed from the inside of the exposure pattern 39 of the mask layer 30. This denotes that a sectional area of the pyramid structure 40 becomes narrower progressively closer to an upper portion of the pyramid structure 40. For example, the pyramid structure 40 may have a conic structure or a hexagonal pyramid (polygonal pyramid) structure. For example, a basic crystalline structure of GaN is a wurtzite structure, and thus, by growing GaN from the buffer layer 20 (exposed by the exposure pattern 39) to have a horned shape, a hexagonal pyramid structure may be formed. In this case, a diameter of a bottom of the pyramid structure 40 may be approximately equal to or slightly greater than that of the exposure pattern 39. When the diameter of the exposure pattern 39 is about 0.5 μm or 5 μm, a height of the pyramid structure 40 may be about 0.5 μm to about 7.5 μm greater by about 1 to 5 times than the diameter of the exposure pattern 39. The bottom of the pyramid structure 40 is overgrown, and thus becomes broader than the exposure pattern 39. The pyramid structure 40 protrudes to on the mask layer 30. The pyramid structure 40 may be formed in a hexagonal pyramid structure.

In an embodiment of the present invention, an example of a crystal growth condition of HVPE is as follows. Ga metal is used as a raw material of Ga, $NH_3$ is used as a raw material of N, and Te or Si is mixed with Ga solution for forming n-type GaN. The substrate with the exposure pattern 39 formed therein is disposed in a reaction pipe, and, by growing a GaN crystal at about 1000° C. to 1100° C., a hexagonal pyramid structure of n-type GaN is formed.

According to another embodiment of the present invention, a composition of the pyramid structure 40 may be $Al_xGa_{(1-x)}N$ ($0<x<1$). By changing a source that is used in growing the pyramid structure 40, a composition of the buffer layer 30 and the composition of the pyramid structure 40 may be formed identically or differently. For example, to obtain an $Al_xGa_{(1-x)}N$ ($0<x<1$) layer that is the buffer layer 20, by adjusting the amount of Al (which is added into Ga solution that is used in forming the buffer layer 20) from 0 g to several g to hundreds mg per 1 g Ga, GaN whose a composition x is 0 to AlN whose a composition x is 1 may be obtained. Also, to obtain an $Al_xGa_{(1-x)}N$ ($0<x<1$) layer that is the buffer layer 20, by adjusting the amount of Al (which is added into Ga solution that is used in forming the pyramid structure 40) from 0 g to several mg to hundreds mg per 1 g Ga, GaN (whose a composition x is 0) to AlN whose a composition x is 1 may be obtained. In this way, the composition of the buffer layer 20 and the composition of the pyramid structure 40 are adjusted by changing a source. That is, the composition of the buffer layer 30 and the composition of the pyramid structure 40 may be formed identically or differently.

Figure 5A:
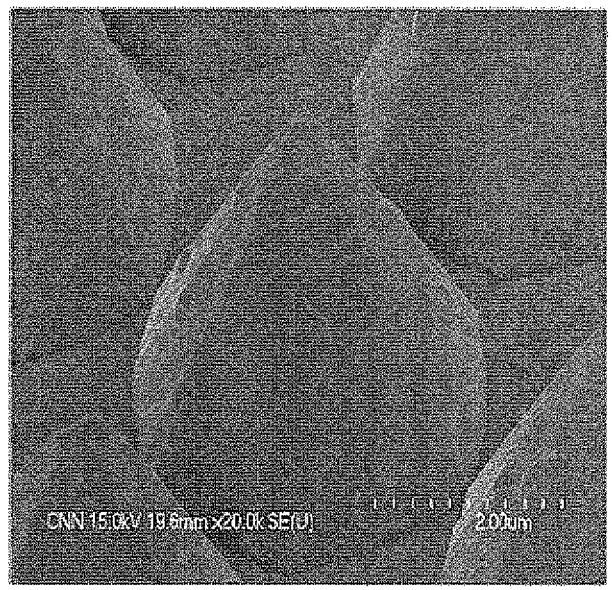
FIGS. 5A to 5C are views illustrating in-process materials of a light-emitting device manufactured in accordance with an embodiment of the present invention.

FIG. 5A is an SEM photograph in a state in which the pyramid structure 40 has been formed in accordance with an embodiment of the present invention.

The pyramid structure 40 is formed, and a semiconductor layer 50 is then formed in operation S130. In an embodiment of the present invention, the semiconductor layer 50 may be formed with the HYPE crystal growing device. For example, growth layers grown from respective side surfaces of the pyramid structures 40 may be coupled, thereby forming the semiconductor layer 50. That is, in the mask layer 30, it is difficult for a crystal to grow from the buffer layer 20. A GaN crystal starts to grow to an inclined side surface of the exposed pyramid structure 40, and crystal layers grown from the semiconductor layer 50 adjacent thereto are adhered to each other, thereby forming the semiconductor layer 50.

In an embodiment of the present invention, a height of the semiconductor layer 50 may be a thickness that enables the pyramid structure 40 to sustain the thickness of the semiconductor layer 50. For example, the height of the semiconductor layer 50 may be about 1 μm to 100 μm.

In an embodiment of the present invention, the composition of the pyramid structure 40 may be GaN or $Al_xGa_{(1-x)}N$ ($0<x<1$). In a growth method, when a source growing the pyramid structure 40 differs from a source growing the semiconductor layer 50, layers having different compositions may be obtained. For example, Ga source reacts with ammonia for forming the pyramid structure 40, and Ga source reacts with Al source and ammonia for forming the semiconductor layer 50. Thus, the pyramid structure 40 is formed of GaN, and the semiconductor layer 50 is formed of AlGaN. In this case, by adjusting the amount of Al, an Al composition of the AlGaN layer may be adjusted. The composition of the pyramid structure 40 is merely one example, and, by changing a source used to form the pyramid structure 40, the pyramid structure 40 having another composition may be formed.

In an embodiment of the present invention, a top of the semiconductor layer 50 may be a flat planarization layer. For example, a crystal may start to grow from approximate half of the height of the pyramid structure 40 to the inclined side surface of the pyramid structure 40, crystals grown from adjacent pyramid structures 40 may be adhered to each other, and then, while maintaining growth until an entire region is planarized, the semiconductor layer 50 may be formed. The bottom of the semiconductor layer 50 may be formed at a position corresponding to one-third of the height of the pyramid structure 40. However, the technical spirit and scope of the present invention are not limited to the height.

An empty space surrounded by the semiconductor layer 50, pyramid structure 40, and mask layer 30 is formed. Thus, a separation layer 90 is formed between the bottom of the semiconductor layer 50 and the mask layer 30.

Figure 5B:
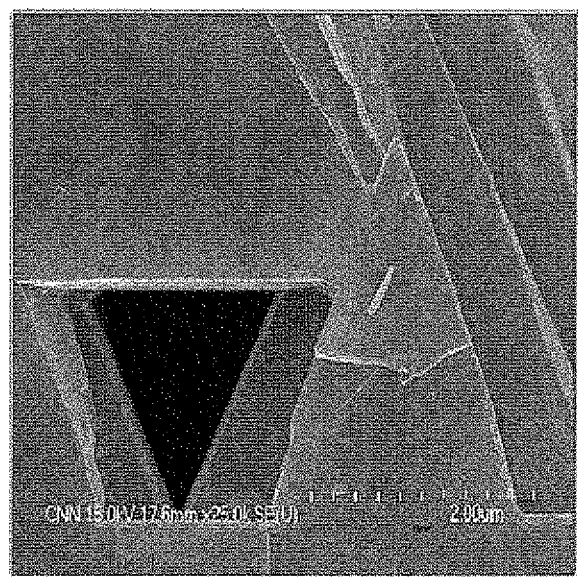

FIG. 5B is a side SEM photograph in a state in which the pyramid structure 40 and the semiconductor layer 50 have been formed in accordance with an embodiment of the present invention, and an empty space next to the pyramid structure can be seen.

In operation S140, a light-emitting stack structure 60 is formed on the semiconductor layer 50. For example, the light-emitting stack structure may be formed by forming an n-type AlGaN cladding layer, an AlGaN active layer, a p-type AlGaN cladding layer, and a p-type GaN cap layer. In an embodiment of the present invention, the light-emitting stack structure 60 may be formed by a HVPE crystal growing process. For example, a cladding layer including n-type $Al_xGa_{(1-x)}N$ ($0<x<1$), an active layer including $Al_xGa_{(1-x)}N$ ($0<x<1$), a cladding layer including p-type $Al_xGa_{(1-x)}N$ ($0<x<1$), and a p-type GaN cap layer may be sequentially formed. Materials of the respective layers of the light-emitting stack structure 60 and a stack sequence may be appropriately changed depending on an emission wavelength range, a light output, or the kind of a light-emitting device.

The buffer layer 20, the semiconductor layer 50, and the light-emitting stack structure 60 may all be formed by the HVPE process, and thus, the buffer layer 20, the semiconductor layer 50, and the light-emitting stack structure 60 may be formed sequentially. For example, the buffer layer 20, the semiconductor layer 50, and the light-emitting stack structure 60 may all be formed by an in-situ process.

In operation S150, the substrate 10, the buffer layer 20, and the mask layer 30 are separated from the light-emitting stack structure 60. Unevenness may be formed on a separated surface. The separation of the substrate 10 may be performed by applying ultrasonic waves, physical vibration, or an impact. For example, when the substrate 10 with the light-emitting stack structure 60 formed therein is put into a solution such as acetone, methanol, or distilled water and is subjected to ultrasonic waves, the pyramid structure 40 is severed from the separation layer 90 in which the semiconductor layer 50 and the buffer layer 40 are connected to only the pyramid structure 40, whereby separation is made. Alternatively, the pyramid structure 40 may be severed by applying a simple impact. Thus, an inverted pyramid structure is formed at the bottom of the semiconductor layer 50. The inverted pyramid structure denotes a structure in which a cross-sectional area increases progressively farther away from the bottom of the semiconductor layer 50. That is, the inverted pyramid structure formed at the semiconductor layer 50 serves as a structure that facilitates separation between the light-emitting device and the substrate 10 used to form the light-emitting device.

Alternatively, even when separation is performed by irradiating a laser beam, separation is performed by irradiating the laser beam on the pyramid structure 40 of the separation layer 90 having relatively weak coupling strength compared to a conventional laser lift-off process, and thus, only a narrow region of a pyramid lower portion is thermally and chemically damaged by the laser beam, whereby the substrate 10 is separated from the light-emitting device without damaging the light-emitting stack structure 60.

Unlike this, stress occurs in the pyramid structure 40 by applying strain to the substrate 10 and/or the buffer layer 20, thereby severing the pyramid structure 40.

Due to the separation layer 90, the light-emitting device is easily separated from the substrate 10, and thus, a complicated process is not performed. Also, when separating the light-emitting device from the substrate 10, the semiconductor layer 50 of the light-emitting device is not damaged, and thus, a good-quality light-emitting device can be manufactured.

Figure 5C:
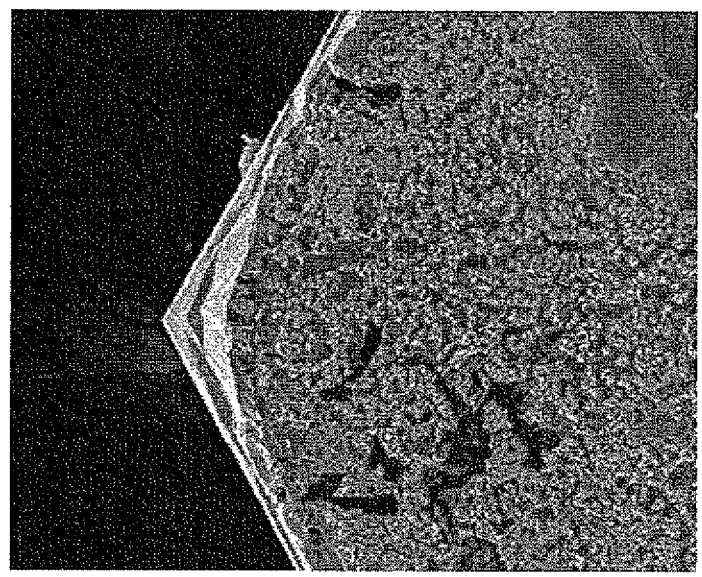
Figure 6A:
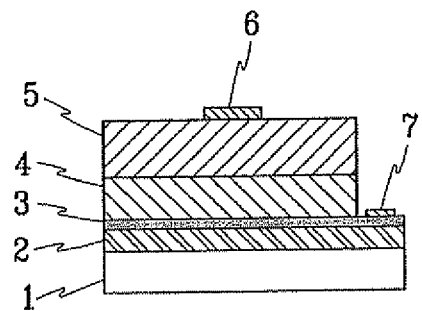
FIGS. 6A and 6B are views schematically illustrating a conventional horizontal light-emitting device and a conventional vertical light-emitting device.
Figure 6B:
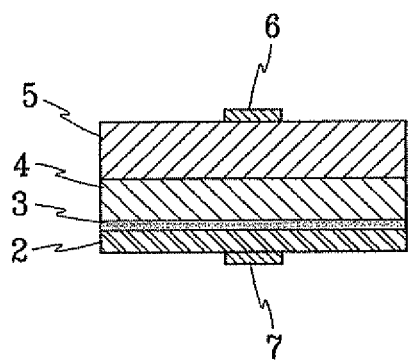

FIG. 5C is an SEM photograph showing the bottom of the separated light-emitting stack structure, and a concave-convex pattern formed in severing the pyramid structure 40 can be seen.

In operation S160, a p-type electrode 71 is formed on the light-emitting stack structure 60, and an n-type electrode 72 is formed at a bottom 51 of the separated semiconductor layer 50, thereby forming the light-emitting device. The n-type electrode 72 may be formed on the inverted pyramid structure, or formed at the bottom 51 of the semiconductor layer 50. Also, a separate intermediate layer may be formed, and then the electrodes 71 and 72 may be completely formed, depending on its design. In this case, in the bottom 51 of the semiconductor layer 50, the inverted pyramid structure may be formed by severing the pyramid structure 40. Also, since the bottom of the pyramid structure 40 is separated from the substrate 10, a protrusion pattern may be formed at the bottom 51 of the semiconductor layer 50 even without a separate pattern process.

Depending on a design, the p-type electrode 71 may be formed immediately before separation operation S510 after operation S140 of forming the light-emitting stack structure 60.

Moreover, the substrate 10, which has a structure before a process of separating the substrate 10 and on which the elements from the buffer layer 20 to the semiconductor layer 50 are formed through operation S140, may be used as a semiconductor template substrate. As an example of the present invention, various electronic device structures are formed on the semiconductor template substrate, and then, by separating the separation layer 90, various vertical semiconductor devices may be manufactured.

Figure 2A:
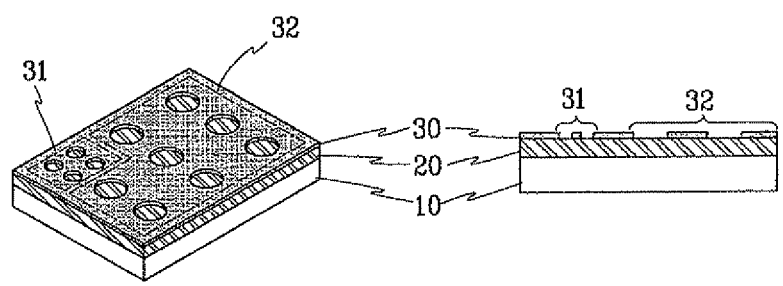
FIGS. 2A and 2B are views for describing a method of manufacturing a light-emitting device in accordance with another embodiment of the present invention.

Next, a method of manufacturing a light-emitting device in accordance with another embodiment of the present invention will be described with reference to FIGS. 2A and 2B. A second embodiment is substantially similar to a first embodiment, but relates to a method in which a region of the separation layer 90 is divided into a plurality of regions having different coupling strengths, and a light-emitting device is formed. Therefore, in forming the mask layer 30, as illustrated in FIG. 2A, the region of the separation layer 90 is divided into a first region 31 having relatively high coupling strength and a second region 32 having relatively low coupling strength. A diameter of each exposure pattern in the first region 31 differs from that of each exposure pattern in the second region 32, and an interval between the exposure patterns in the first region 31 differs from an interval between the exposure patterns in the second region 32. Specifically, the diameter of each exposure pattern in the first region 31 having relatively high coupling strength is less than that of each exposure pattern in the second region 32 having relatively low coupling strength, and the interval between the exposure patterns in the first region 31 is less than the interval between the exposure patterns in the second region 32. For example, the diameter of each exposure pattern and the interval between the exposure patterns in the first region 31 may be 1 µm, and the diameter of each exposure pattern and the interval between the exposure patterns in the second region 32 may be 3 µm.

Figure 2B:
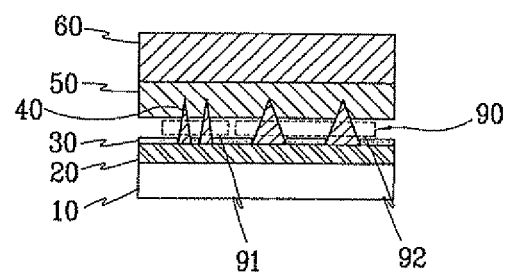

In this case, as illustrated in FIG. 2B, in forming the pyramid structure 40, the pyramid structure 40 formed in the first region 31 has a gradient higher than the pyramid structure 40 formed in the second region 32. In the pyramid structure 40 formed in the first region 31, hexagonal pyramids are closely adhered to each other, and thus, an empty space is relatively reduced. Therefore, the separation layer 90 formed between the mask layer 30 and the semiconductor layer 50 is divided into a first separation part 91 having relatively high coupling strength and a second separation part 92 having relatively low coupling strength.

In forming a plurality of light-emitting devices on the substrate 10, even though the second separation part 92 having relatively low coupling strength is separated by a physical force that is generated in a process after the semiconductor layer 50 is formed, the light-emitting stack structure 60 is supported by the first separation part 91 having relatively high coupling strength. Accordingly, the second embodiment is useful for a case in which the p-type electrode 71 is first formed before the separation layer 90 is separated.

Next, a method of manufacturing a light-emitting device in accordance with another embodiment of the present invention will be described with reference to FIGS. 3A to 3D. In the above-described method of manufacturing the light-emitting device, a method of manufacturing one light-emitting device has been described. However, the present embodiment relates a method of manufacturing light-emitting devices in which a plurality of light-emitting devices are formed on one substrate and easily separated from the one substrate, and moreover, the light-emitting devices are easily separated from each other. Therefore, a manufacturing method similar to FIG. 1 will not be described.

Figure 3A:
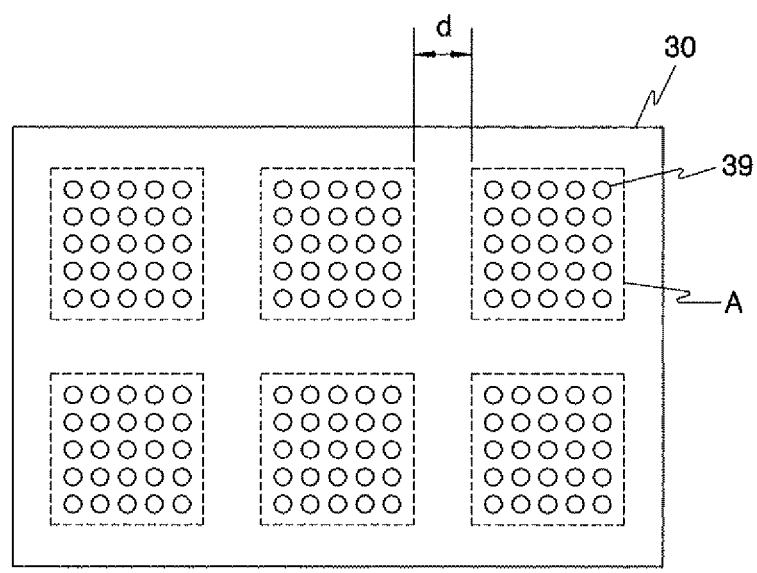
FIGS. 3A to 3G are views for describing a method of manufacturing a light-emitting device in accordance with another embodiment of the present invention.

First, as described above with reference to FIG. 1, a buffer layer 20 is formed on a substrate 10, and a mask layer 30 that is as illustrated in FIG. 3A is formed on the buffer layer 20. The mask layer 30 has a plurality of light-emitting chip regions 'A'. In FIG. 3A, for convenience of a description, each of the light-emitting chip regions 'A' is illustrated in a tetragonal shape. However, the light-emitting chip area 'A' is not limited to a tetragonal shape, and may be formed in various shapes such as a circular shape and a hexagonal shape depending on its design. The light-emitting chip regions 'A' are separated from each other by a certain chip interval 'd'.

A plurality of exposure patterns 39 are formed in each light-emitting chip region of the mask layer 30.

Figure 3B:
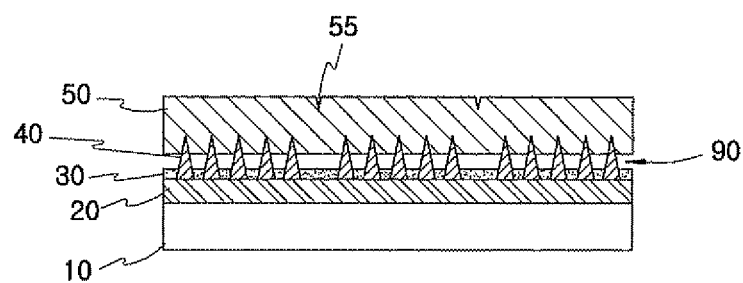

For example, in an embodiment of the present invention, the mask layer 30 is formed, and then, as illustrated in FIG. 3B, a plurality of pyramid structures 40 are formed by selectively growing a crystal from the buffer layer 20 in the HVPE process, whereupon a semiconductor layer 50 is formed. In this case, a cleavage surface 55 that divides the semiconductor layer 50 into a plurality of separate light-emitting stack structures may be formed. A depth of the cleavage surface 55 may be adjusted to a depth a user desires, depending on a chip interval 'd' and a process condition.

Moreover, in an embodiment of the present invention, when a height of a formed light-emitting stack structure is 'h', the depth of the cleavage surface 55 may be adjusted by adjusting a ratio of the height 'h' and the chip interval 'd'. For example, by adjusting the chip interval 'd' to less by about 0.4 to 0.6 times than the height 'h', as illustrated in FIG. 3C, a structure may be formed in which only a portion of the semiconductor chip 50 is connected and the light-emitting stack structures 60 are separated from each other.

Figure 3C:
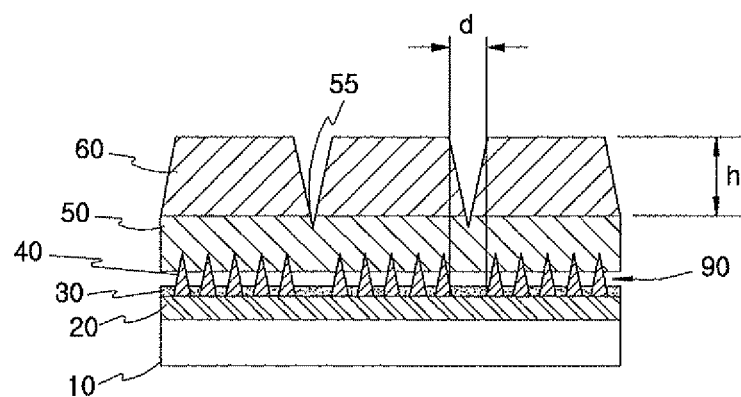

When the semiconductor layer 50 is completely formed, as illustrated in FIG. 3C, the light-emitting stack structure is formed on the semiconductor layer 50. In this case, the light-emitting stack structure 60 is divided into a plurality of light-emitting chip regions by the cleavage surface 51 of the semiconductor layer 50 for the formation thereof.

Figure 3D:
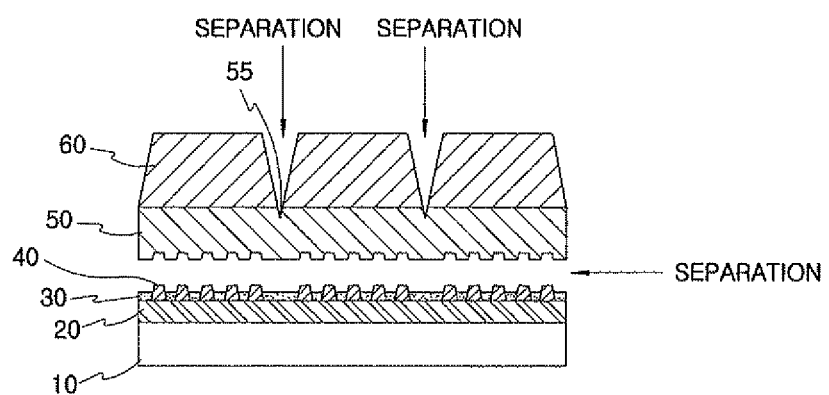

As illustrated FIG. 3C, after the light-emitting device is formed up to the light-emitting stack structure 60, each of the light-emitting devices is separated in vertical and horizontal directions. Such a separation process may be performed in different sequences. For example, as illustrated in FIG. 3D, by applying ultrasonic waves, vibration, or an impact to a separation layer 90, the substrate 10 is first separated in the vertical direction, and each of the light-emitting devices is then be separated in the horizontal direction. Separation in the horizontal direction may be performed by various processes using a physical impact or pressurization. For example, a film is adhered onto the light-emitting devices, and then, by compressing the film with a roller, each of the light-emitting devices may be separated. Alternatively, by applying appropriate vibration or pressure, separation in the horizontal direction and separation in the vertical direction may be performed simultaneously.

Subsequently, a p-type electrode (not shown) is formed on the light-emitting stack structure 60, and an n-type electrode (not shown) is formed at a bottom of the separated semiconductor layer 50, thereby finishing the light-emitting device. Depending on a design, a separate intermediate layer may be formed and each of the electrodes is then completely formed. Depending on the case, the p-type electrode (not shown) may be formed at an appropriate time before or after a vertical separation operation and after a horizontal separation operation. Also, the n-type electrode (not shown) may be formed before or after the horizontal separation operation.

Figure 4:
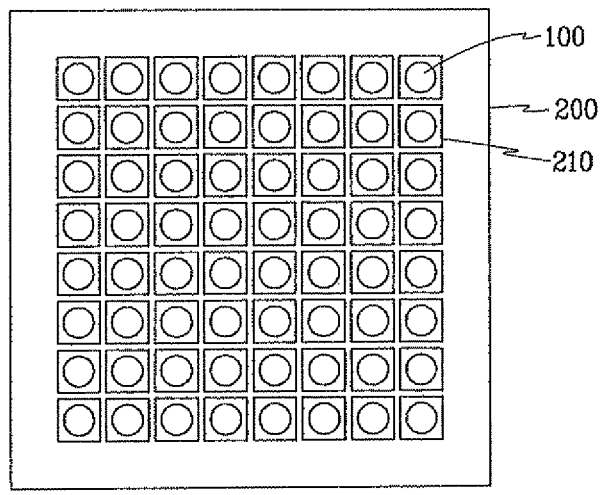
FIG. 4 is a view schematically illustrating a jig for forming an electrode.

When the p-type electrode (not shown) and the n-type electrode (not shown) are separated into respective light-emitting chips and formed, as illustrated in FIG. 4, a jig 200 for forming an electrode may be used. The jig 200 includes a matrix type of chip mounting parts 210 having an appropriate size for accommodating a plurality of light-emitting chips. A chip selector selects a chip and adds the selected chip into each of chip mounting parts 210 included in the jig 200, and then, the electrodes are formed.

Figure 3E:
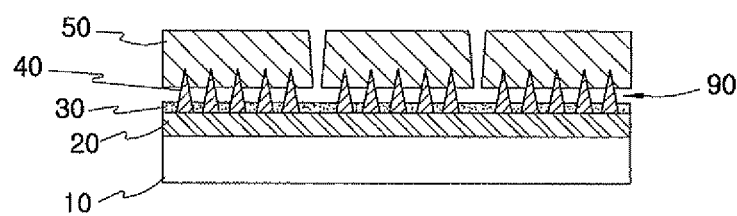
Figure 3F:
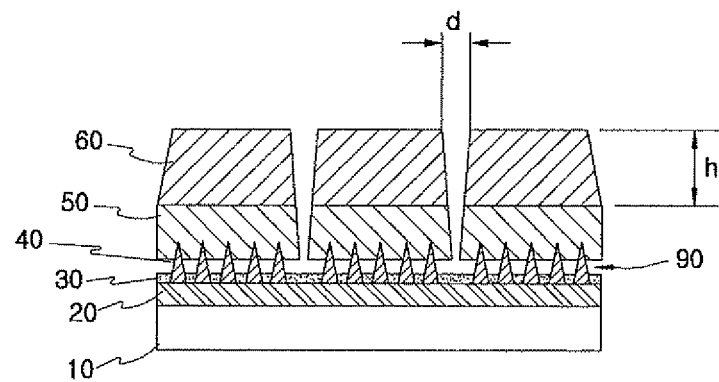
Figure 3G:
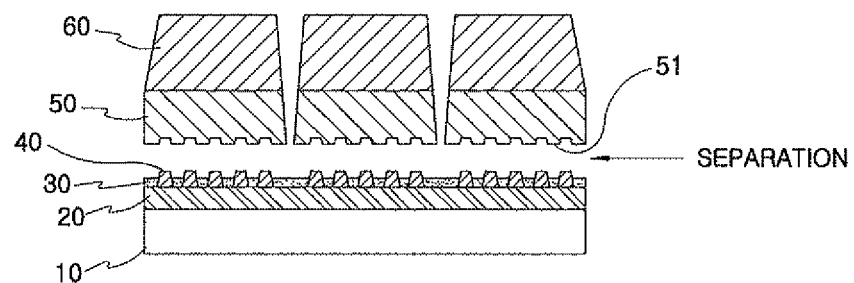

Referring to FIGS. 3E to 3G, in another embodiment of the present invention, the mask layer 30 is formed, and then, by selectively growing a crystal from the buffer layer 20, the plurality of pyramid structures are formed, whereupon the semiconductor layer 50 is formed. In this case, as illustrated FIG. 3E, the semiconductor layer 50 may be separated and formed in units of separate light-emitting device. For example, by adjusting the chip interval d to greater by 0.4 to 0.6 times than the height h, the separately separated semiconductor layers 50 and the separate light-emitting stack structures 60 may be formed. Specifically, as illustrated in FIG. 3F, the light-emitting stack structure 60 may be formed on each of the semiconductor layers 50, and, as illustrated in FIG. 3G, the semiconductor layers 50 may be separated from the buffer layer 30, thereby obtaining the separate light-emitting stack structures 60. Subsequently, the p-type electrode (not shown) is formed on each of the light-emitting stack structures 60, and the n-type electrode (not shown) is formed at a bottom of each of the separated semiconductor layers 50, thereby finishing the plurality of light-emitting devices.

In the light-emitting device of the present invention, a semiconductor layer is formed on a pyramid structure, and then, by forming a light-emitting stack structure, a crystalline defective density is reduced, thus minimizing substrate dependency.

Moreover, in the present invention, it is not required to use a high-cost conductive metal substrate in manufacturing a vertical light-emitting device, and moreover, a substrate can be simply separated from a light-emitting device without performing the laser lift-off process necessary for using an insulating substrate, thus enhancing usefulness. Accordingly, a process of manufacturing a vertical light-emitting device can be simplified, and the manufacturing cost can be largely saved.

Furthermore, according to the embodiments of the present invention, a hexagonal pyramid structure in a light-emitting region is formed by adjusting a chip interval and a height of a light-emitting stack structure in the light-emitting region, thereby forming a planarization nitride semiconductor layer. Accordingly, vertical separation and horizontal separation between light-emitting chips can be easily performed, and a manufacturing process can be simplified.

According to the light-emitting device manufacturing methods of the present invention, a concave-convex pattern in which a hexagonal pyramid structure has been partially severed is formed in a bottom of the planarization nitride semiconductor layer, and thus, without an additional process, provided can be a light-emitting device for maximizing light emission efficiency.

While the invention has been shown and described with respect to the embodiments, the present invention is not limited thereto. It will be understood by those skilled in the art that various changes and modifications may be made without departing from the scope of the invention as defined in the following claims.

The invention claimed is:

1. A method of manufacturing a light-emitting device, the method comprising:

forming a buffer layer on a substrate;

dividing the buffer layer into a plurality of light-emitting device regions, and respectively forming a plurality of pyramid structures in the light-emitting device regions;

growing the plurality of pyramid structures from respective tops thereof to form a semiconductor layer having a cleavage surface that divides the light-emitting device regions, wherein the semiconductor layer and the buffer layer are connected by the pyramid structures, and the semiconductor layer is separated from the buffer layer;

forming a light-emitting stack structure on the semiconductor layer to form a separate auxiliary light-emitting device;

severing each of the plurality of pyramid structures to strip the semiconductor layer from the buffer layer; and separating the separate auxiliary light-emitting device with respect to the cleavage surface.

2. The method of claim 1, wherein said severing each of the plurality of pyramid structures to strip the semiconductor layer from the buffer layer comprises severing each of the plurality of pyramid structures to leave a portion of each of the plurality of pyramid structures at one surface of the semiconductor layer.

3. The method of claim 1, wherein said severing each of the plurality of pyramid structures to strip the semiconductor layer from the buffer layer and the separating the separate auxiliary light-emitting device are performed simultaneously.

4. The method of claim 1, further comprising adjusting an interval between the pyramid structures to adjust a depth of the cleavage surface.

5. The method of claim 1, wherein an interval between the light-emitting device regions is less by about 0.6 times than a height of the light-emitting stack structure.

6. The method of claim 1, wherein said forming the plurality of pyramid structures comprises crystal-growing some portions of the buffer layer to form the plurality of pyramid structures.

7. The method of claim 6, further comprising:

forming a mask layer, having an exposure pattern, on the buffer layer to expose said some portions through the exposure pattern.

8. The method of claim 6, wherein the semiconductor layer and the light-emitting stack structure are formed of a material including nitride, and said forming the semiconductor layer and the forming the light-emitting stack structure are sequentially performed.

9. The method of claim 2, further comprising: after said severing each of the plurality of pyramid structures to strip the semiconductor layer from the buffer layer, forming a first electrode at a first surface of the light-emitting stack structure; and forming a second electrode at a surface of the semiconductor layer in which a portion of each of the pyramid structures is left.

10. The method of claim 8, further comprising:

before said severing each of the plurality of pyramid structures to strip the semiconductor layer from the buffer layer, forming a first electrode at a surface of the light-emitting stack structure.

11. The method of claim 2, wherein said severing each of the plurality of pyramid structures to strip the semiconductor layer from the buffer layer uses a physical impact.

12. The method of claim 2, wherein said severing each of the plurality of pyramid structures to strip the semiconductor layer from the buffer layer comprises applying a strain to the substrate.

13. The method of claim 6, wherein a sectional area of each of the plurality of pyramid structures decreases progressively closer from the buffer layer to each of the semiconductor layers, and said severing each of the plurality of pyramid structures to strip the semiconductor layer from the buffer layer comprises applying a physical impact.

* * * * *